US007876131B2

(12) United States Patent
Chuang et al.

(10) Patent No.: US 7,876,131 B2
(45) Date of Patent: *Jan. 25, 2011

(54) DUAL GATE TRANSISTOR KEEPER DYNAMIC LOGIC

(75) Inventors: Ching-Te Chuang, South Salem, NY (US); Keunwoo Kim, Somers, NY (US); Jente Benedict Kuang, Austin, TX (US); Kevin John Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 388 days.

This patent is subject to a terminal disclaimer.

(21) Appl. No.: 11/859,351

(22) Filed: Sep. 21, 2007

(65) Prior Publication Data

US 2009/0302894 A1 Dec. 10, 2009

Related U.S. Application Data

(63) Continuation of application No. 11/168,692, filed on Jun. 28, 2005, now Pat. No. 7,336,105.

(51) Int. Cl.
*H03K 19/20* (2006.01)
*H03K 19/094* (2006.01)
*H01L 21/84* (2006.01)

(52) U.S. Cl. .................... 326/121; 326/98; 438/157
(58) Field of Classification Search ............... 326/112, 326/119, 121, 126, 127
See application file for complete search history.

(56) References Cited

U.S. PATENT DOCUMENTS

| 5,457,404 | A | 10/1995 | Sharpe-Geisler | 326/17 |
| 6,002,292 | A | 12/1999 | Allen et al. | 327/121 |
| 6,414,354 | B1 * | 7/2002 | Hirano | 257/347 |
| 6,414,356 | B1 * | 7/2002 | Forbes et al. | 257/350 |
| 6,549,040 | B1 | 4/2003 | Alvandpour et al. | 326/98 |

(Continued)

OTHER PUBLICATIONS

Alvandpour, et. al. "A Conditional Keeper Technique for Sub-0.13 nm Wide Dynamic Gates," *Microprocessor Research Labs, Intel Corporation*, 2001, pp. 29, 30.

(Continued)

*Primary Examiner*—Rexford N Barnie
*Assistant Examiner*—Dylan White
(74) *Attorney, Agent, or Firm*—Greg Law Firm, PLLC; Rakesh Garg; Libby Z. Toub

(57) ABSTRACT

A dynamic logic gate has a device for charging a dynamic node during a pre-charge phase of a clock. A logic tree evaluates the dynamic node with a device during an evaluate phase of the clock. The dynamic node has a keeper circuit comprising an inverter with its input coupled to the dynamic node and its output coupled to the back gate of a dual gate PFET device. The source of the dual gate PFET is coupled to the power supply and its drain is coupled to the dynamic node forming a half latch. The front gate of the dual gate PFET is coupled to a logic circuit with a mode input and a logic input coupled back to a node sensing the state of the dynamic node. The mode input may be a slow mode to preserve dynamic node state or the clock delayed that turns ON the strong keeper after evaluation.

18 Claims, 7 Drawing Sheets

U.S. PATENT DOCUMENTS

| | | | |
|---|---|---|---|
| 6,791,364 B2* | 9/2004 | Alvandpour et al. | 326/98 |
| 6,914,452 B2 | 7/2005 | Gauthier et al. | 326/98 |
| 6,978,387 B2 | 12/2005 | Bosshart | 713/300 |
| 7,002,375 B2 | 2/2006 | Hsu et al. | 326/95 |
| 7,034,576 B2 | 4/2006 | Levy et al. | 326/98 |
| 7,053,663 B2* | 5/2006 | Hazucha et al. | 326/121 |
| 7,336,105 B2* | 2/2008 | Chuang et al. | 326/121 |
| 2003/0001623 A1* | 1/2003 | Alvandpour et al. | 326/98 |
| 2006/0290383 A1* | 12/2006 | Chuang et al. | 326/97 |

OTHER PUBLICATIONS

Chiang, Meng-Hsueh et. al. "Novel High-Density Low-Power High-Performance Double-Gate Logic Techniques," *IBM T.J. Watson Research Center*, 2004, pp. 122, 123.

Kim, C.H., et. al., "A Process Variation Compensating Technique for Sub-90 nm Dynamic Circuits," *Dept. of ECE, Purdue University and Circuit Research, Intel Labs*, 2003, pp. 205, 206.

* cited by examiner

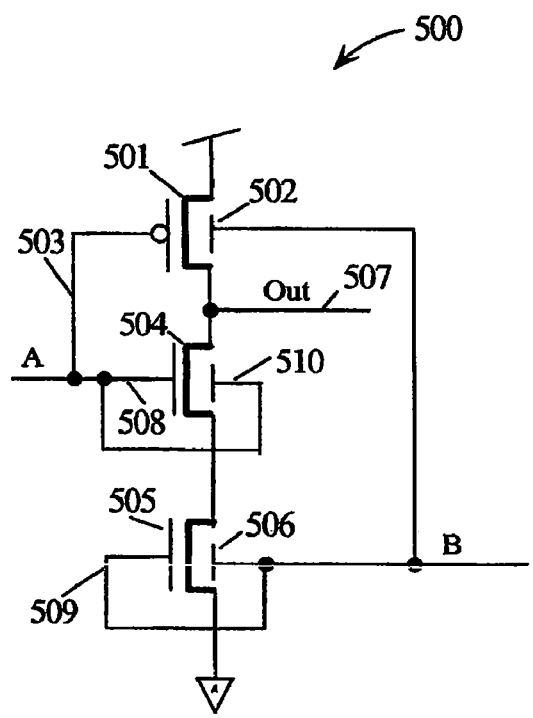
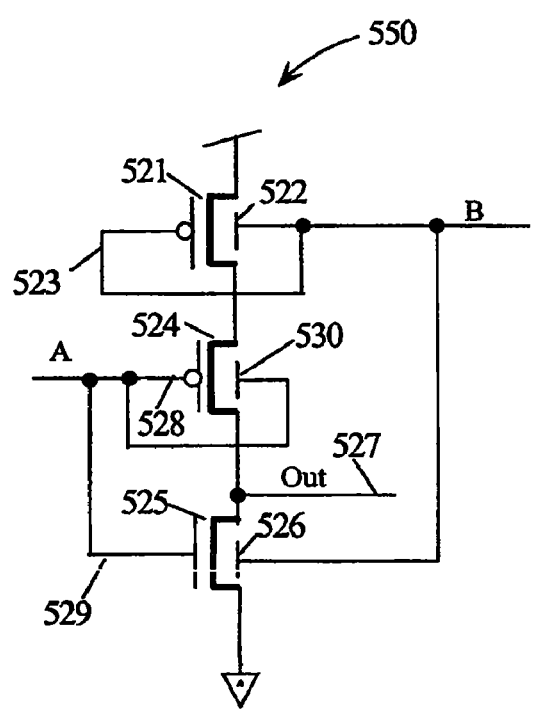
FIG. 2A
(Prior Art)
FIG. 2B
(Prior Art)

DUAL GATE TRANSISTOR KEEPER DYNAMIC LOGIC

RELATED APPLICATIONS

This application is a continuation of U.S. patent application Ser. No. 11/168,692 entitled "Dual Gate Transistor Keeper Dynamic Logic", filed Jun. 28, 2005.

GOVERNMENT RIGHTS

This invention was made with Government support under DARPA NBCH3039004, BGR WO132280. THE GOVERNMENT HAS CERTAIN RIGHTS IN THIS INVENTION.

TECHNICAL FIELD

The present invention relates to dynamic logic circuits, and in particular, to dynamic logic circuits using a timed keeper for holding the state of the dynamic node.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1 illustrating an exemplary three-input OR dynamic logic gate. Dynamic logic 100 includes three inputs A, B and C coupled to a corresponding gate of N channel field effect transistors (NFETs) 101-103. During an evaluate phase (logic one) of clock 104, NFET 106 is turned ON, and if any of inputs A, B or C are a logic one, dynamic node 108 is pulled low (logic zero), and OUT transitions to a logic one via inverter 110. During the precharge phase (logic zero) of Clk 104, dynamic node 108 is precharged to a logic one via P channel field effect transistor (PFET) 112. Half-latch PFET 114 maintains the charge on dynamic node 108 through the evaluate phase unless one or more of inputs A, B or C is turned ON. Consequently, dynamic node 108 undergoes two discharge-precharge cycles. OUT similarly undergoes two discharge-precharge cycles, albeit with opposite phase. Because OUT is discharged during the precharge phase of dynamic node 108, even though the Boolean value of the logical function is "true", the dynamic logic gate dissipates power even when the input signal states are unchanged.

Dynamic logic may use a footer NFET 106 or not. In the case the footer NFET 106 is not used, the inputs A, B, and C must be timed to be valid during the evaluate phase of Clk 104. Regardless, dynamic circuits rely on the ability to precharge the dynamic node to a logic one state in advance of having valid logic inputs valid. In logic circuitry with a wide input fan-in, there are many parallel paths in the form of one or more intermediate nodes that may be coupled to the dynamic node by one or more select devices. When a select device connects the intermediate nodes to the dynamic node, leakage current may make it difficult to hold the logic state on the dynamic node after completion of evaluation. This is especially true as device size decreases.

The sharp increase of leakage currents in scaled technologies severely limits the robustness of dynamic circuits, especially for high fan in wide dynamic gates, commonly employed in the performance critical units of high-performance microprocessors. A strong keeper is necessary in the pre-charged state or after the completion of evaluation to compensate for the large leakage current and to hold the right state at the dynamic node. However, the use of a strong (large) keeper results in severe contention during the evaluation phase causing significant degradation of the performance. Recently, a "conditional keeper" technique has been proposed in the art where only a small fraction of the keeper is turned ON at the onset of the evaluation phase while a large fraction of the keeper is only turned ON after a delay time and only if the dynamic output remains at a logic one. This scheme reduces the contention during evaluation and thus improves the performance of the dynamic logic gate. Furthermore, the strong keeper improves the noise margin and robustness of the dynamic logic gate. Alternatively, a programmable keeper has been proposed where the effective width of the keeper is optimally programmed based on die leakage to compensate for variations in die-to-die leakage. While effective, both of these techniques result in increased area of the dynamic logic gate and added capacitance to the dynamic node which increase cost and degrade performance.

Therefore, there is a need for a dynamic logic gate with a conditional keeper that does not significantly increase circuit area or dynamic node capacitance.

SUMMARY OF THE INVENTION

A dynamic logic gate has a pre-charge device for charging a dynamic node in response to one phase of a clock signal. A logic tree receives logic inputs and evaluates the dynamic node with a footer device in response to the second phase of the clock signal. The output of the dynamic logic gate is generated by isolating the dynamic node with a static logic gate (usually an inverter). The dynamic node has a keeper circuit comprising another inverter with its input coupled to the dynamic node and its output coupled to the front gate of a dual gate PFET device. The source of the dual gate PFET is coupled to the power supply and its drain is coupled back to the dynamic node forming a half latch. The back gate of the dual gate PFET device is coupled to a logic gate that has a mode input and an input coupled back to a node sensing the state of the dynamic node. The mode input may be a true slow mode to preserve the dynamic node state during low frequency testing or the delayed clock signal that turns ON the strong keeper after successful evaluation. The dual gate PFET may be either a asymmetrical dual gate device where the front gate is stronger than the back gate or a symmetrical dual gate device where the strength of the front and back gates are equal.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which:

FIG. 2A is a circuit diagram of a NAND logic gate implemented using dual gated FET devices;

FIG. 2B is a circuit diagram of a NOR logic gate implemented using dual gated FET devices;

DETAILED DESCRIPTION

Figure 1:
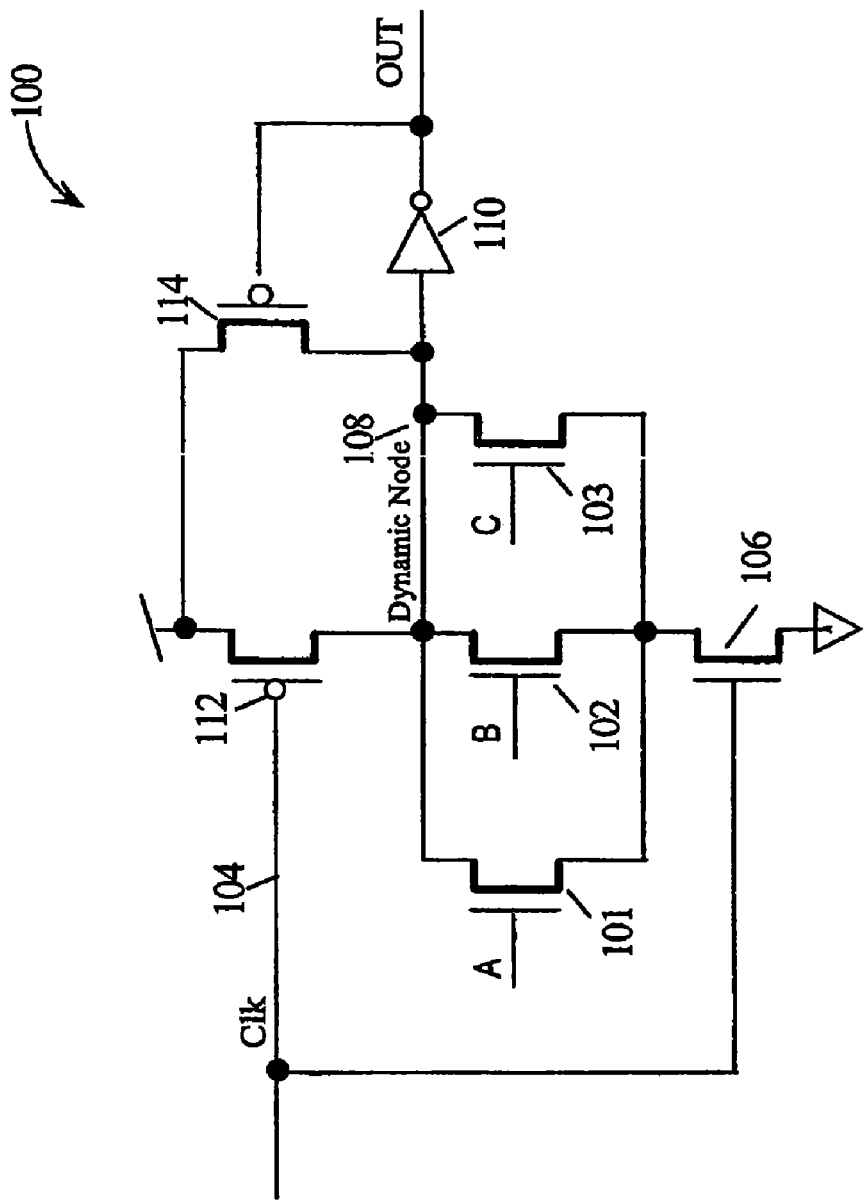
FIG. 1 illustrates, in schematic form, a dynamic logic gate which may be used in conjunction with the present invention.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

Refer now to the drawings wherein depicted elements are not necessarily shown to scale and wherein like or similar elements are designated by the same reference numeral through the several views.

Dual or double gate FET devices have been described in the literature. Two references are included in the following which explain differing architectures of dual gated FET devices including symmetrical and asymmetrical structures. These references explain details of these devices and the size and thus capacitance reduction that results from using a dual gated FET device in place of two single gate FET devices in appropriate applications. The reader is referred to "Double-Gate CMOS: Symmetrical-Gate Versus Asymmetrical-Gate Devices" IEEE Transactions on Electron Devices, Vol. 48, NO. 2, February 2001 and "Novel High-Density Low-Power High-Performance Double-Gate Logic Techniques", IEEE International SOI Conference, 2004.

The separate, independent biasing of the front and back gate in double gate devices has been exploited to reduce the number of transistors required for implementing logic functions to improve the performance, power and area of the circuits. Prior art, however, is limited to the "logic" transistors, and not the "keeper" or intermediate node pre-charged device in the dynamic gate.

FIG. 2A is a circuit diagram of a two input NAND logic gate implemented using three dual gate FET devices 501, 504, and 505. Normally, a two input NAND logic gate requires two PFET devices and two NFET devices using single gate FET devices. Dual gate PFET 501 is turned ON when either its front gate 503, coupled to input A, or its back gate 502, coupled to input B, is a logic zero. NFET 504 has its front gate 508 and back gate 510 tied together and coupled to input A and is turned ON when input A is a logic one. NFET 505 has its front gate 509 and its back gate 506 tied together and coupled to input B and is turned ON when input B is a logic one. Output 507, therefore, is pulled low when input A and input B are a logic one generating the logic NAND function.

FIG. 2B is a circuit diagram of a two input NOR logic gate 550 implemented using three dual gate FET devices 521, 524, and 525. Normally, a two input NOR logic gate requires two PFET devices and two NFET devices using single gate FET devices. Dual gate PFET 521 has its front gate 523 and back gate 522 tied together and coupled to input B and is turned ON when input B is a logic zero. PFET 524 has its front gate 528 tied to its back gate 530 and coupled to input A, and is turned ON when input A is a logic zero. NFET 525 is turned ON when either its front gate 529, coupled to input A, or its back gate 526, coupled to input B, is a logic one. Output 527, therefore, is pulled low when input A or input B is a logic one generating the logic NOR function.

FIG. 2A and FIG. 2B represent prior art circuits where single dual gate devices serve as two parallel "logic" transistors with independent biasing of front and back gate (PFET 501 in FIG. 2A, and NFET 525 in FIG. 2B).

Figure 3:
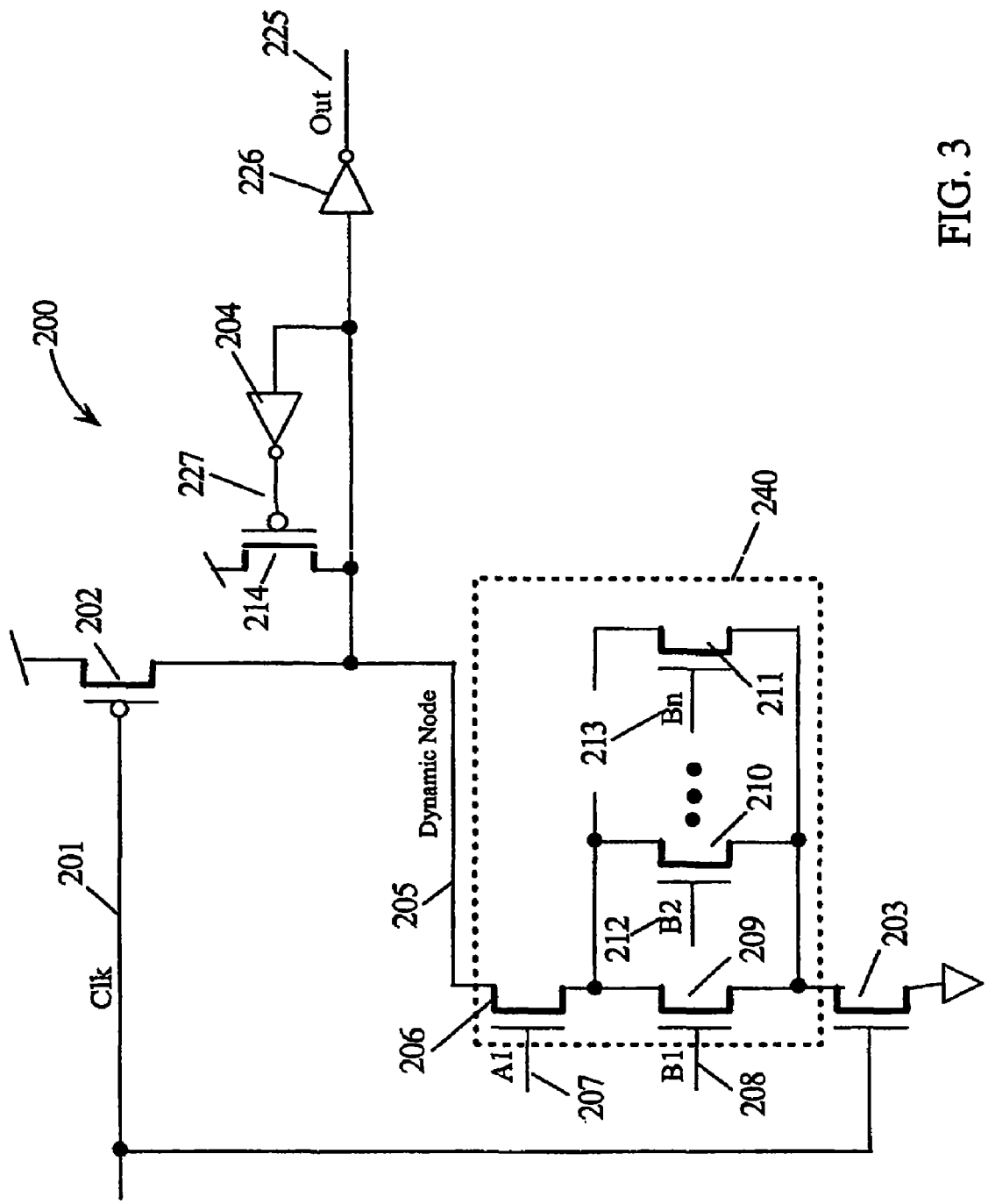
FIG. 3 is a circuit schematic of a dynamic logic gate with keeper circuitry.

FIG. 3 is a dynamic logic gate 200 illustrating a logic tree 240 coupled to a dynamic node 205. Clk 201 is a clock signal having a logic one evaluate cycle and a logic zero pre-charge cycle. Logic tree 240 has a footer device 203 used to control the timing of evaluation of logic inputs A1 207, B1 208, B2 212, Bn 213. Logic tree 240 pulls dynamic node 205 to a logic zero if A1 207 is a logic one AND one of inputs B1 208, B2 212 through Bn 213 is a logic one. A half latch is formed by PFET 214 and inverter 204 for holding the pre-charge state of dynamic node 205 after completion of evaluation. Inverter 226 is a static gate that generates Out 225 which has the same logic state as node 227 driving the gate of PFET 214.

Figure 4:
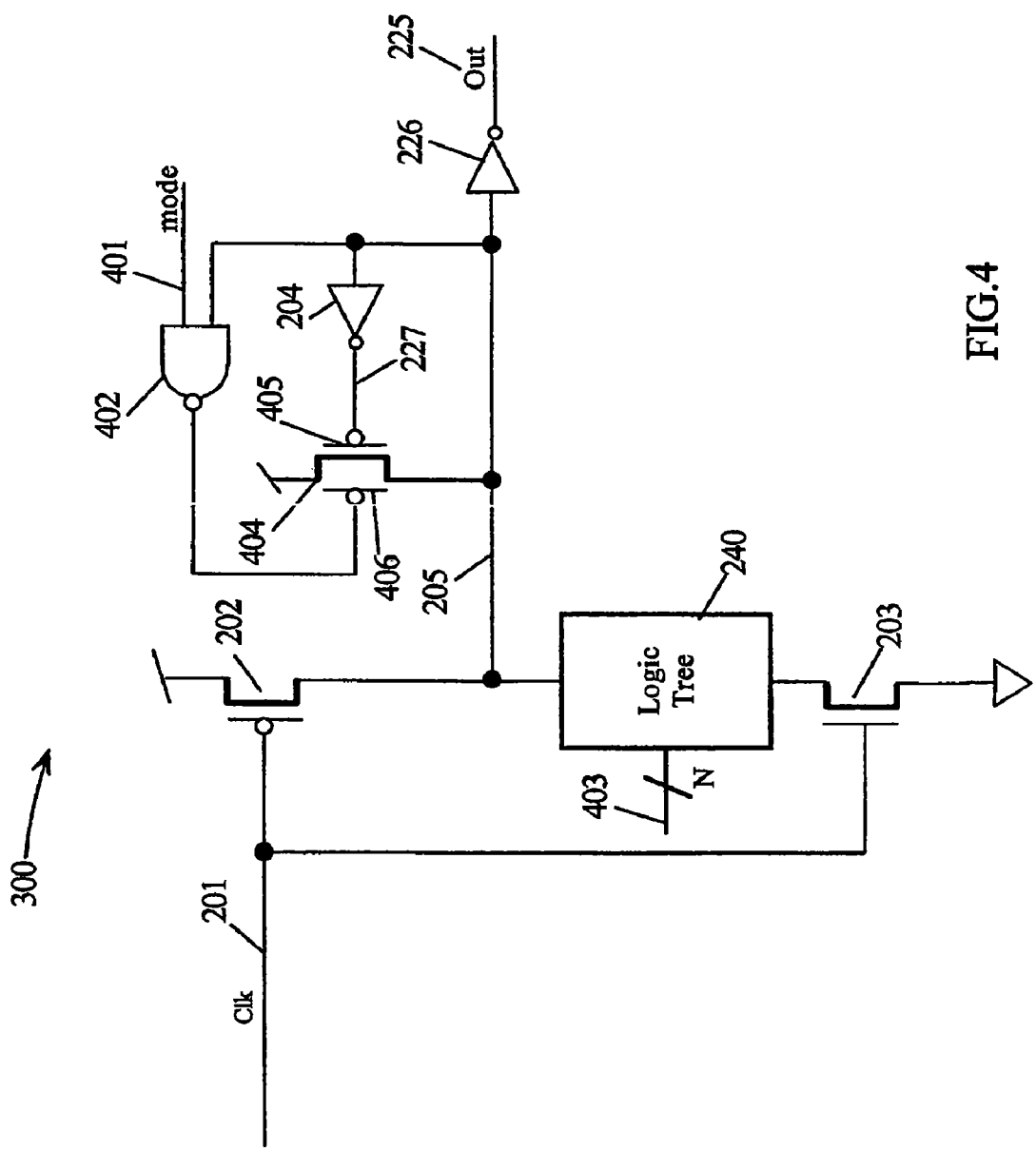
FIG. 4 is a circuit schematic of a dynamic logic gate with keeper circuitry according to one embodiment of the present invention.

FIG. 4 is a dynamic logic gate 300 according to embodiments of the present invention. Clk 201 is a clock signal having a logic one evaluate cycle and a logic zero pre-charge cycle. Logic tree 240 has a footer device 203 used to control the timing of evaluation of logic inputs 403. Logic tree 240 either pulls dynamic node 205 to a logic zero or leaves it at its logic one pre-charge state in response to the Boolean combination of the N logic inputs 403.

A half latch is formed by the front gate 405 of dual gate PFET 404 and inverter 204 for holding the state of dynamic node 205 after completion of evaluation. Dual gate PFET 404 has a front gate 405 and a back gate 406. These gates operate in parallel wherein each gate is operable to turn ON the channel between the source coupled to the power supply and the drain coupled to dynamic node 205. Dual gate PFET 404 may be an asymmetrical device or a symmetrical device. If dual gate PFET 404 is an asymmetrical device, back gate 406 provides a weaker channel than front gate 405. However, the channel conduction produced by the front gate is strongly influenced by the back gate. When the front gate is ON and the back gate is OFF the channel conduction is much lower than if both gates are ON. The conduction of the channel between the source and drain is modulated by the back gate 406 and the current when both front gate 405 and back gate 406 are ON is approximately twice the current when only front gate 405 is ON. If dual gate PFET 404 is a symmetrical device, back gate 406 and front gate 405 have equal "strength" channels.

For normal operation with an asymmetrical dual gate PFET 404, the keeper circuitry of inverter 204 and front gate 405 "weakly" re-enforces the logic one state after completion of evaluation when the dynamic node 205 evaluates to a logic one because the back gate 406 is at a logic one and is OFF when mode 401 is a logic zero. NAND gate 402 turns ON back gate 406 when the dynamic node 205 is a logic one AND the mode control signal 401 is a logic one. The mode control signal 401 may be used for either a test mode at low frequency, or for a normal operation with the mode signal 401 driven by a delayed clock signal (e.g., Clk 201 delayed). If the mode control signal 401 is Clk 201 delayed, the mode signal 401 transitions to a logic one a delay time after the start of the evaluation phase and back gate 406 transitions to a logic zero and the dynamic node is "strongly" re-enforced if the dynamic node evaluates to a logic one. If dynamic node 205 evaluates to a logic zero, then NAND 402 remains de-gated. Inverter 226 is a static gate that generates Out 225 which has the same logic state as node 227 driving the front gate 405 of dual gate PFET 404.

Figure 5:
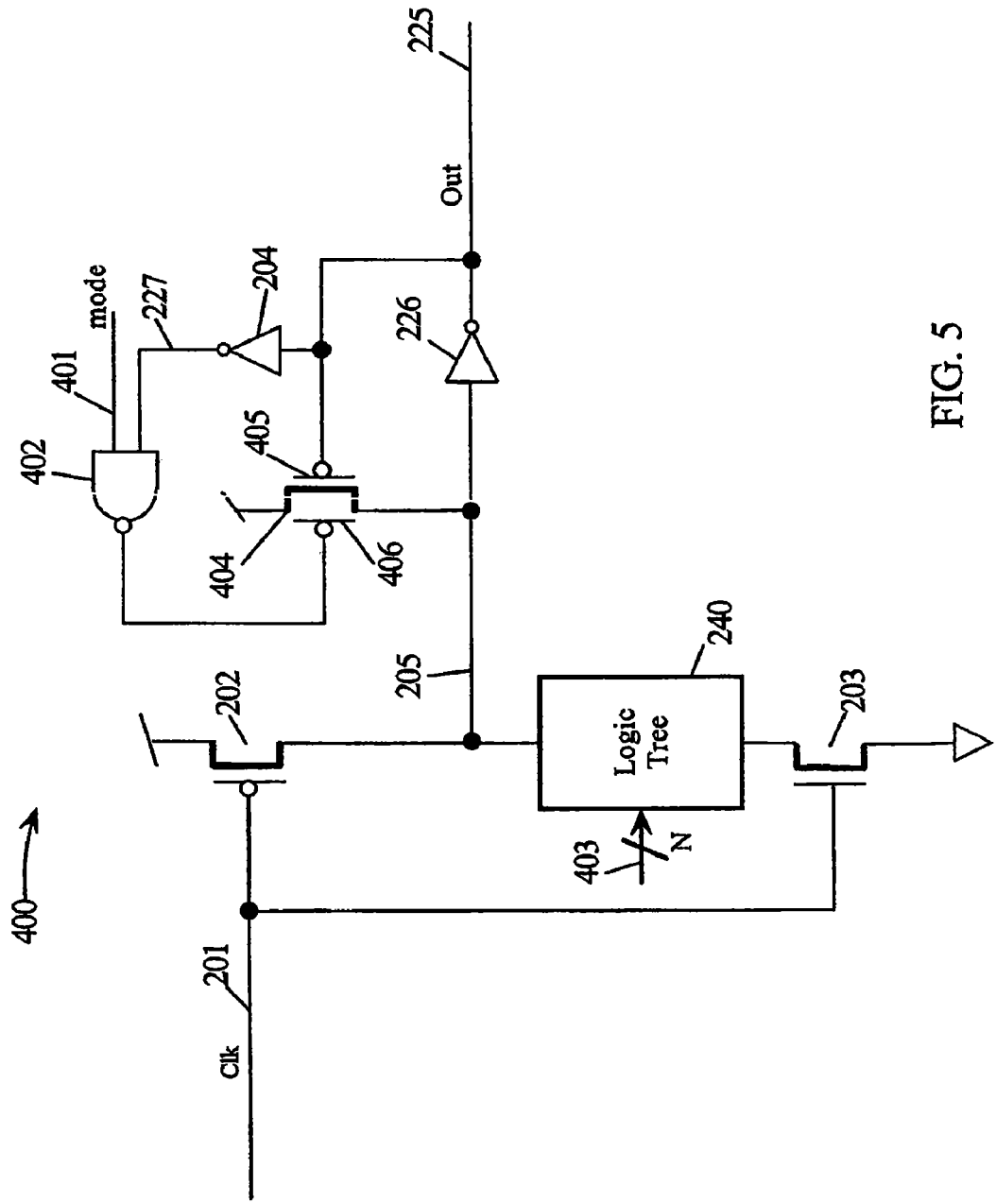
FIG. 5 is a circuit schematic of a dynamic logic gate with keeper circuitry according to another embodiment of the present invention.

FIG. 5 is a dynamic logic gate 400 according to another embodiment of the present invention. Dynamic logic gate 400 is the same as dynamic logic gate 300 in FIG. 4 except for the configuration of the keeper circuitry coupled to the dynamic node 205. Again, Clk 201 is a clock signal having a logic one evaluate cycle and a logic zero pre-charge cycle. Logic tree 240 has a footer device 203 used to control the timing of evaluation of logic inputs 403. Logic tree 240 either pulls dynamic node 205 to a logic zero or leaves it at its logic one pre-charge state in response to the Boolean combination of the N logic inputs 403.

A half latch is formed by the front gate 405 of dual gate PFET 404 and inverter 226 for holding the state of dynamic node 205 after the completion of evaluation. Inverter 226 also serves as the static gate to isolate the dynamic node from Out 225. Dual gate PFET 404 has a front gate 405 and a back gate 406. These gates operate in parallel wherein each gate is operable to turn ON the channel between the source coupled to the power supply and the drain coupled to dynamic node 205. If dual gate PFET 404 is an asymmetrical device, back gate 406 provides a weaker channel than front gate 405. However, the channel conduction produced by the front gate is strongly influenced by the back gate. When the front gate is ON and the back gate is OFF the channel conduction is much lower than if both gates are ON. The conduction of the channel between the source and drain is modulated by the back gate 406 and the current when both front gate 405 and back gate 406 are ON is approximately twice the current when only front gate 405 is ON. If dual gate PFET 404 is a symmetrical device, back gate 406 and front gate 405 have equal "strength" channels.

For normal operation with an asymmetrical dual gate PFET 404, the keeper circuitry of inverter 204 and front gate 405 "weakly" re-enforces the logic one state after completion of evaluation when the dynamic node 205 evaluates to a logic one because the back gate 406 is at a logic one and is OFF. NAND gate 402 turns ON back gate 406 when output 225 is a logic zero (the dynamic node 205 is a logic one) and the mode control signal 401 is a logic one. The mode control signal 401 may be again used for either a test mode at low frequency, or for a normal operation with the mode signal 401 driven by a delayed clock signal (e.g., Clk 201 delayed). If the mode control signal 401 is the delayed clock signal, the mode signal 401 transitions to a logic one a delay time after the start of the evaluation phase and back gate 406 transitions to a logic zero and the dynamic node is "strongly" re-enforced if the dynamic node evaluates to a logic one. If dynamic node 205 evaluates to a logic zero, then NAND 402 remains de-gated.

Functionally dynamic logic gates 400 and 300 are the same, they differ in that dynamic logic gate 400 isolates the input of NAND 402 coupled to the dynamic node 205 and adds extra delay (2 inverter delays, from inverter 226 to inverter 204, between the dynamic node 205 and input 227 to NAND gate 402) in turning ON the back gate 406. Inverter 226 is a static gate that generates Out 225 which has the opposite logic state as node 227 coupled to NAND 402.

Figure 6:
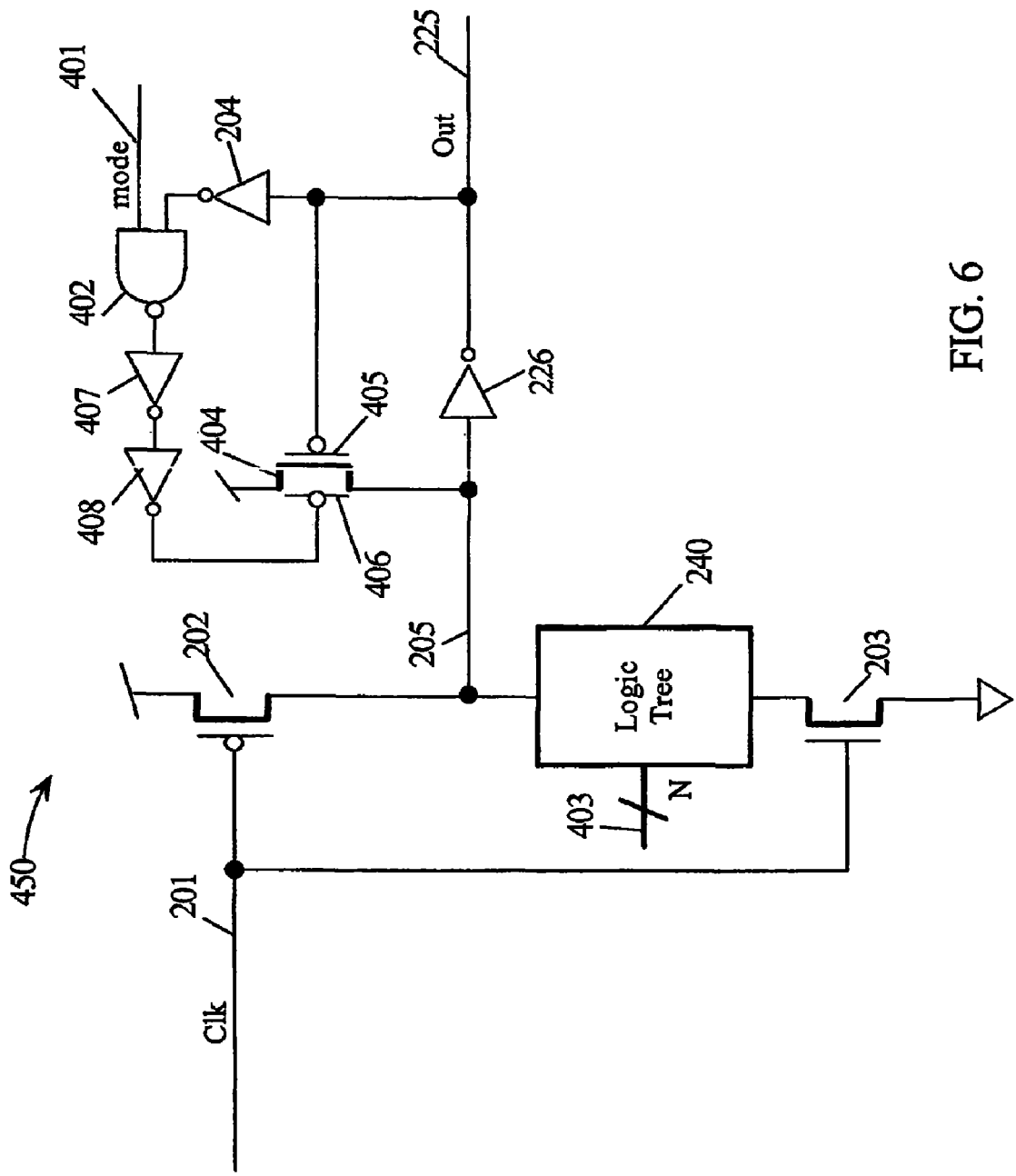
FIG. 6 is a circuit schematic of a dynamic logic gate with keeper circuitry according to yet another embodiment of the present invention.

FIG. 6 is a dynamic logic gate 450 according to another embodiment of the present invention. Dynamic logic gate 450 is the same as dynamic logic gate 400 in FIG. 5 except for the configuration of the keeper circuitry coupled to the dynamic node 205. Again, Clk 201 is a clock signal having a logic one evaluate cycle and a logic zero pre-charge cycle. Logic tree 240 has a footer device 203 used to control the timing of evaluation of logic inputs 403. Logic tree 240 either pulls dynamic node 205 to a logic zero or leaves it at its logic one pre-charge state in response to the Boolean combination of the N logic inputs 403.

A half latch is formed by the front gate 405 of dual gate PFET 404 and inverter 226 for holding the state of dynamic node 205 after the completion of evaluation. Inverter 226 also serves as the static gate to isolate the dynamic node from Out 225. Dual gate PFET 404 has a front gate 405 and a back gate 406. These gates operate in parallel wherein each gate is operable to turn ON the channel between the source coupled to the power supply and the drain coupled to dynamic node 205. If dual gate PFET 404 is an asymmetrical device, back gate 406 provides a weaker channel than front gate 405. However, the channel conduction produced by the front gate is strongly influenced by the back gate. When the front gate is ON and the back gate is OFF the channel conduction is much lower than if both gates are ON. The conduction of the channel between the source and drain is modulated by the back gate 406 and the current when both front gate 405 and back gate 406 are ON is approximately twice the current when only front gate 405 is ON. If dual gate PFET 404 is a symmetrical device, back gate 406 and front gate 405 have equal "strength" channels.

For normal operation with an asymmetrical dual gate PFET 404, the keeper circuitry of inverter 226 and front gate 405 "weakly" re-enforces the logic one state after completion of evaluation when the dynamic node 205 evaluates to a logic one because the back gate 406 is at a logic one and is OFF when mode 401 is a logic zero. Additional delay over the keeper circuit of FIG. 5 may be provided by adding inverter delays. For example inverters 407 and 408 may be added to the output of NAND 402. NAND gate 402 turns ON back gate 406 when output 225 is a logic zero (the dynamic node 205 is a logic one) and the mode control signal 401 is a logic one. The mode control signal 401 may be again used for either a test mode at low frequency, or for a normal operation with the mode signal 401 driven by a delayed clock signal (e.g., Clk 201 delayed). If the mode control signal 401 is the delayed clock signal, then the mode signal 401 transitions to a logic one a delay time after the start of the evaluation phase. The dynamic node 205 is "strongly" re-enforced after completion of evaluation if the dynamic node 205 evaluates to a logic one. If dynamic node 205 evaluates to a logic zero, then NAND 402 remains de-gated. Functionally dynamic logic gates 400 and 450 are the same, they differ in that dynamic logic gate 450 isolates the input of NAND 402 coupled to the dynamic node 205 and adds extra delays (2 inverter delays, from inverter 407 and inverter 408) between the output of NAND 402 and back gate 406. Inverter 226 is a static gate that generates Out 225.

Figure 7:
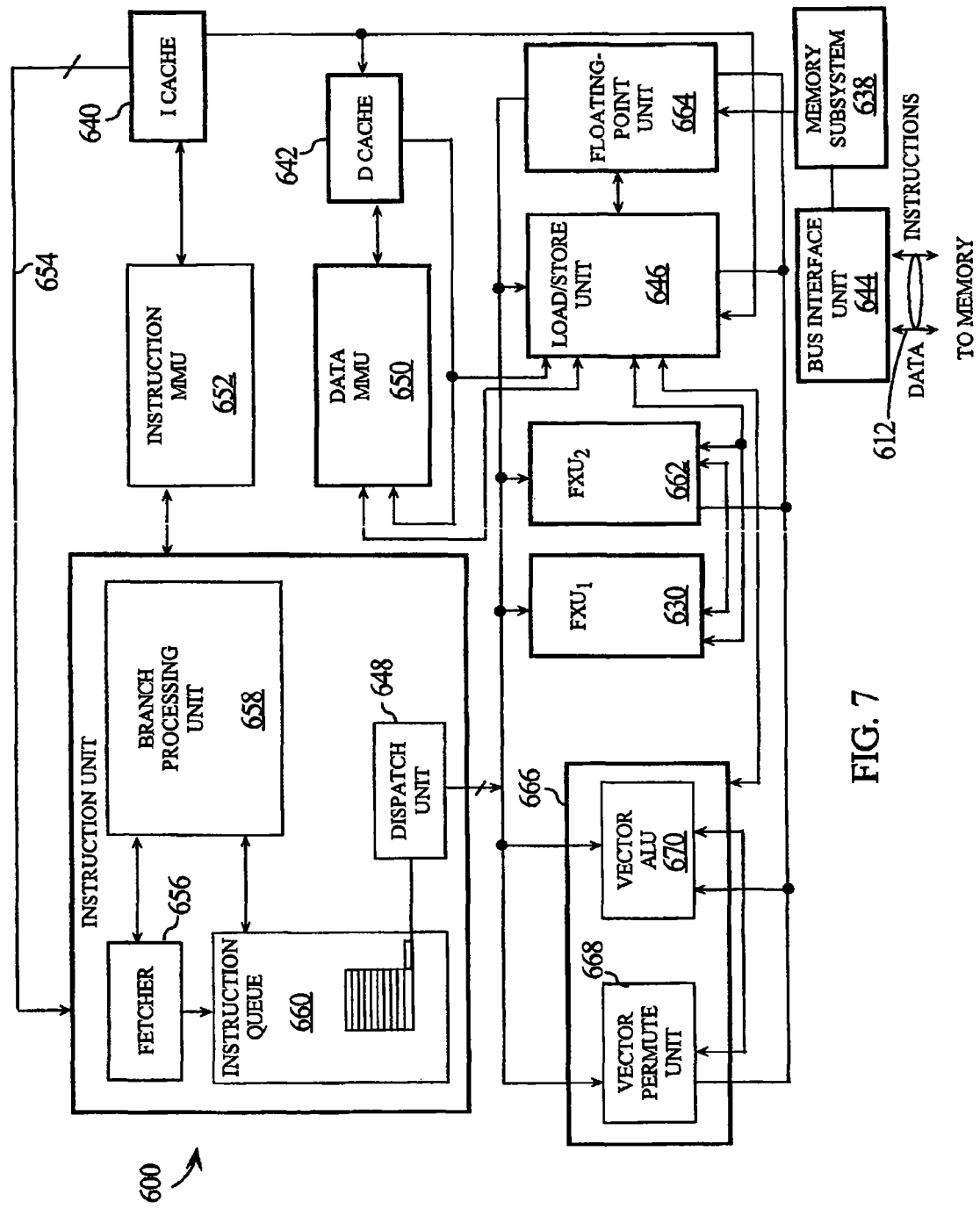
FIG. 7 illustrates a high level block diagram of selected operational blocks within a central processing unit (CPU) incorporating the present inventive principles.

FIG. 7 is a high level functional block diagram of selected operational blocks that may be included in a central processing unit (CPU) 600. In the illustrated embodiment, CPU 600 includes internal instruction cache (I-cache) 640 and data cache (D-cache) 642 which are accessible to memory (not shown in FIG. 4) through bus 612, bus interface unit 644, memory subsystem 638, load/store unit 646 and corresponding memory management units: data MMU 650 and instruction MMU 652. In the depicted architecture, CPU 600 operates on data in response to instructions retrieved from I-cache 640 through instruction dispatch unit 648. Dispatch unit 648 may be included in instruction unit 654 which may also incorporate fetch unit 656 and branch processing unit 658 which controls instruction branching. An instruction queue 660 may interface fetch unit 656 and dispatch unit 648. In response to dispatched instructions, data retrieved from D-cache 642 by load/store unit 646 can be operated upon by one of fixed point unit (FXU) 630, FXU 662 or floating point execution unit (FPU) 664. Additionally, CPU 600 provides for parallel processing of multiple data items via vector execution unit (VXU) 666. VXU 666 includes vector permute unit 668 which performs permutation operations on vector operands, and vector arithmetic logic unit (VALU) 670 which performs vector arithmetic operations, which may include both fixed-point and floating-point operations on vector operands. VALU 670 may be implemented using dynamic logic gates 300, 400 or 500 in accordance with the present inventive principles. Other units may also employ dynamic logic gates 300, 400 or 450 according to embodiments of the present invention Although the present invention and its advantages have been described in detail, it should be understood that various changes, substitutions and alterations can be made herein without departing from the spirit and scope of the invention as defined by the appended claims.

What is claimed is:

1. A dynamic logic circuit having a clock input coupled to a clock signal, a plurality of logic inputs and a logic output comprising:
    a dynamic node pre-charged in response to a pre-charge phase of the clock signal;
    a logic tree for evaluating the dynamic node in response to a Boolean combination of the plurality of logic input signals and an evaluation phase of the clock signal;
    keeper logic having a first input coupled to the dynamic node via an inverter that isolates the dynamic node, a second input coupled to a mode signal, a first output and a second output; and
    a single transistor keeper device having a first input coupled to the first output of the keeper logic, a second input coupled to the second output of the keeper logic with a delay, a power supply terminal coupled to a first voltage potential of a power supply, and a keeper terminal coupled to the dynamic node, wherein the keeper device couples the dynamic node to the first voltage potential of a power supply with a first conductivity in response to a first logic state of the dynamic node and couples the dynamic node to the first voltage potential of the power supply with a second conductivity in response to a logic combination of the first logic state of the dynamic node and a logic state of a mode signal.

2. The dynamic logic circuit of claim 1 further comprising a static logic circuit having an input coupled to the dynamic node and an output generating the logic output of the dynamic logic gate.

3. The dynamic logic circuit of claim 1, wherein the dynamic node is coupled to a first voltage potential of a power supply in response to the pre-charge phase of the clock signal and decoupled from the first voltage potential in response to evaluate phase of the clock signal.

4. The dynamic logic circuit of claim 3, wherein the dynamic node is coupled to the first voltage potential of the power supply with a PFET having a source coupled to the first voltage potential of the power supply, a drain coupled to the dynamic node, and a gate coupled to the clock signal.

5. The dynamic logic circuit of claim 2, wherein the static logic circuit is a logic inverter having an input coupled to the dynamic node and an output generating the logic output of the dynamic logic circuit.

6. The dynamic logic circuit of claim 1, wherein the keeper logic circuit comprises:
    a logic inverter having an input coupled to the dynamic node and an output coupled to the first input of the single keeper device; and
    a logic gate having a first input coupled to the mode signal and a second input coupled to the dynamic node.

7. The dynamic logic circuit of claim 1, wherein the single keeper device is a dual gate PFET having a back gate terminal coupled to the first output of the keeper logic circuit, a front gate terminal coupled to the second output of the keeper logic circuit, a drain terminal coupled to the dynamic node, and a source terminal coupled to the first voltage potential of the power supply.

8. The dynamic logic circuit of claim 7, wherein the dual gate PFET is a symmetrical device and the front gate turns ON the dual gate PFET with the first conductivity, the back gate turns ON the dual gate PFET with the second conductivity, and the first conductivity is equal to the second conductivity.

9. The dynamic logic circuit of claim 1, wherein the keeper logic circuit has a third output generating the logic output of the dynamic logic gate.

10. A data processing system comprising:
    a central processing unit (CPU); and
    a memory operable for communicating instructions and operand data to the CPU, wherein the CPU includes one or more dynamic logic circuits each having a dynamic node pre-charged in response to a pre-charge phase of the clock signal, a logic tree for evaluating the dynamic node in response to a Boolean combination of the plurality of logic input signals and an evaluation phase of the clock signal, keeper logic having a first input coupled to the dynamic node via an inverter that isolates the dynamic node, a second input coupled to a mode signal, a first output and a second output, and a single transistor keeper device having a first input coupled to the first output of the keeper logic, a second input coupled to the second output of the keeper logic with a delay, a power supply terminal coupled to a first voltage potential of a power supply, and a keeper terminal coupled to the dynamic node, wherein the keeper device couples the dynamic node to the first voltage potential of a power supply with a first conductivity in response to a first logic state of the dynamic node and couples the dynamic node to the first voltage potential of the power supply with a second conductivity in response to a logic combination of the first logic state of the dynamic node and a logic state of a mode signal.

11. The data processing system of claim 10 further comprising a static logic circuit having an input coupled to the dynamic node and an output generating the logic output of the dynamic logic gate.

12. The data processing system of claim 11, wherein the static logic circuit is a logic inverter having an input coupled to the dynamic node and an output generating the logic output of the data processing system.

13. The data processing system of claim 10, wherein the dynamic node is coupled to a first voltage potential of a power supply in response to the pre-charge phase of the clock signal and decoupled from the first voltage potential in response to evaluate phase of the clock signal.

14. The data processing system of claim 13, wherein the dynamic node is coupled to the first voltage potential of the power supply with a PFET having a source coupled to the first voltage potential of the power supply, a drain coupled to the dynamic node, and a gate coupled to the clock signal.

15. The data processing system of claim 10, wherein the keeper logic circuit comprises:

a logic inverter having an input coupled to the dynamic node and an output coupled to the first input of the single keeper device; and a logic gate having a first input coupled to the mode signal and a second input coupled to the dynamic node.

16. The data processing system of claim 10, wherein the single keeper device is a dual gate PFET having a back gate terminal coupled to the first output of the keeper logic circuit, a front gate terminal coupled to the second output of the keeper logic circuit, a drain terminal coupled to the dynamic node, and a source terminal coupled to the first voltage potential of the power supply.

17. The data processing system of claim 16, wherein the dual gate PFET is a symmetrical device and the front gate turns ON the dual gate PFET with the first conductivity, the back gate turns ON the dual gate PFET with the second conductivity, and the first conductivity is equal to the second conductivity.

18. The data processing system of claim 10, wherein the keeper logic circuit has a third output generating the logic output of the dynamic logic gate.

* * * * *